United States Patent
Hoayun

(10) Patent No.: US 9,564,903 B2
(45) Date of Patent: Feb. 7, 2017

(54) PORT SPREADING

(71) Applicant: Qualcomm Technologies International, Ltd., Cambridge (GB)

(72) Inventor: Paul Simon Hoayun, Willingham (GB)

(73) Assignee: QUALCOMM TECHNOLOGIES INTERNATIONAL, LTD., Cambridge (GB)

( * ) Notice: Subject to any disclaimer, the term of this patent is extended or adjusted under 35 U.S.C. 154(b) by 176 days.

(21) Appl. No.: 14/135,693

(22) Filed: Dec. 20, 2013

(65) Prior Publication Data

US 2015/0180477 A1   Jun. 25, 2015

(51) Int. Cl.

| H03K 19/177 | (2006.01) |
|---|---|
| H01L 23/495 | (2006.01) |
| H01L 25/065 | (2006.01) |
| H03K 19/0175 | (2006.01) |

(52) U.S. Cl.
CPC ... *H03K 19/17744* (2013.01); *H01L 23/49524* (2013.01); *H01L 23/49541* (2013.01); *H01L 23/49548* (2013.01); *H01L 25/0657* (2013.01); *H03K 19/017581* (2013.01); *H01L 23/49531* (2013.01); *H01L 23/49575* (2013.01); *H01L 2224/48091* (2013.01)

(58) Field of Classification Search
USPC .............. 326/38, 101; 257/203.776
See application file for complete search history.

(56) References Cited

U.S. PATENT DOCUMENTS

| 5,787,299 A | 7/1998 | Ostler et al. |
|---|---|---|
| 2008/0290375 A1* | 11/2008 | Chang et al. ................. 257/203 |
| 2014/0247084 A1 | 9/2014 | Girdhar et al. |

FOREIGN PATENT DOCUMENTS

WO   WO 2005/117114 A2   12/2005

OTHER PUBLICATIONS

GB Search Report issued in related GB Application No. 1414017.2, dated Feb. 19, 2015.

* cited by examiner

*Primary Examiner* — Yu Chen
*Assistant Examiner* — Nilufa Rahim
(74) *Attorney, Agent, or Firm* — Procopio, Cory, Hargreaves & Savitch

(57) ABSTRACT

A semiconductor die having: a logic unit having a plurality of inputs/outputs; a plurality of pads whereby electrical connections can be made to the die; and a multiplexer arranged between the inputs/outputs and the pads, the multiplexer being operable in a first mode in which it maps a first number of the inputs/outputs to a first number of the pads with a first mean spacing between those pads, and a second mode in which it maps a second number of the inputs/outputs to a first number of the pads with a second mean spacing between those pads, wherein the first number is larger than the second number and the first spacing is smaller than the second spacing.

14 Claims, 2 Drawing Sheets

PORT SPREADING

This invention relates to configuring input and output ports for an integrated circuit.

BACKGROUND

FIG. 1 is a cross-sectional view of an integrated circuit package. The package comprises a semiconductor die 1 on which is defined an electronic circuit. The die has a series of conductive pads 2 around its periphery. Numerous ones of the pads are attached to conductive traces 3 which extend from the die into a packaging matrix 4. The packaging matrix is formed of a non-conductive material, conventionally a polymer material. FIG. 2 is a simplified cross-section through the package on line A-A in FIG. 1. FIG. 2 shows that the conductive traces extend out of the plane of FIG. 1 so that they emerge at package connection pins 5. The package illustrated in FIGS. 1 and 2 is a QFN (quad flat no leads) package.

Some dies can be packaged in different ways for different applications. For example, a simple application that requires only some of the die's capabilities might only need to connect to 16 of the die's pads. Since that application only requires 16 pins, for that application the die can be packaged in a package whose dimensions are relatively small. Having a small package has the advantage that the device will take up less room on a circuit board. In contrast, in a more complex application it might be desired to connect to 64 of the die's pads. That would call for 64 pins, and hence a package that is large enough to accommodate 64 pins. The cost of preparing to manufacture a die is high, so it is advantageous to be able to use the same die for both these applications. Since the die will be the same in each type of packaging, it follows that the margin between the die and the periphery of the package will be smaller in the small package than in the large package. This is illustrated in FIG. 3.

FIG. 3 shows cross sections through the packaging of a common die 10 in a small package 11 and a large package 12.

FIG. 3 shows some of the traces emanating from the dies 10. In the larger package 12 many pads on the die are used. Because the margin between the die and the edge of the package is extensive, all the traces can extend at a substantial angle to the side of the die from which they emanate. In the smaller package 11 two possibilities are illustrated. On one side, at 13, the traces emanate from pads that are well spaced apart on the die. These traces all extend at substantial angles to the side of the die from which they emanate. On the other side, at 14, the traces emanate from pads that are close together on the die. Some of these traces also extend at substantial angles to the side of the die from which they emanate. However, due to the narrow margin in the smaller-sized package some of these traces must extend at lesser angles to the side of the die in order to maintain an adequate spacing between the points at which the traces terminate in the lead-out plane. For example, trace 15 extends at an angle of less than 45° to the relevant side of the die, as indicated at 16.

In chip packaging it is generally desirable for the angle at which the leads extend from the die to be as high as possible, preferably greater than 45°. Otherwise the electrical connection between the lead and its pad on the die can be unreliable or difficult to manufacture. One way to rectify the situation shown at 14 in FIG. 3 would be to physically relocate the relevant pads on the die. The die could be designed so that the pads that are to be used with the smaller chip package are separated from each other by pads that provide input/output functions that are only used in the larger-packaged device. The problem with this is that the pads that are to be used in the smaller-packaged device might provide some collective function: for example there might be four pads that together provide a UART interface. If those four pads are interspersed among other pads then when they emerge as pins in the larger-packaged device they might be spaced apart from each other even though they are to be used together. That makes it complicated to define a circuit board to which the larger package is to be connected. Of course, the leads could be re-mapped inside the package in order to rearrange them, but it is desirable to keep any rearrangement to a minimum. Indeed, it is desirable for each pin to directly overlie the end of its corresponding lead in the lead-out layer. Another option is to use different dies for the smaller and larger packages, but that would increase cost.

It is known for a die to have a multiplexer inboard of its pads in order to allow a group of input/output lines to be shifted as a block to a different set of pads. This can allow a device to adapt its pinouts to mimic another device, or to comply with a particular type of circuit board layout.

There is a need for a better way to allow a single die to be packaged in different forms.

SUMMARY OF THE INVENTION

According to one aspect of the present invention there is provided a semiconductor die having: a logic unit having a plurality of inputs/outputs; a plurality of pads whereby electrical connections can be made to the die; and a multiplexer arranged between the inputs/outputs and the pads, the multiplexer being operable in a first mode in which it maps a first number of the inputs/outputs to a first number of the pads with a first median spacing between adjacent ones of those pads, and a second mode in which it maps a second number of the inputs/outputs to a first number of the pads with a second median spacing between adjacent ones of those pads, wherein the first number is larger than the second number and the first spacing is smaller than the second spacing.

In the second mode for the majority of pairings of neighbouring pads that are mapped to inputs/outputs in that mode (i.e. pads that are used in that mode), the pads of that pairing may conveniently be separated by at least one other pad that is not in use in that mode. In contrast, in the first mode for some or all of the pairings of neighbouring pads that are mapped to inputs/outputs in that mode, that pads of that pairing may be adjacent to each other, with no intervening unused pad. In the second mode for all the pairings of neighbouring pads that are mapped to inputs/outputs in that mode, and are on the same side (i.e. an edge of the die in the plane of the die), the pads of that pairing may be separated by at least one other pad that is not in use in that mode. In the second mode all the used pads, or the majority of the used pads, may be separated from each other either by an unused pad or by a corner of the die.

The die may comprise one or more one-time-programmable elements whose state determines whether the multiplexer operates in the first mode or the second mode. The multiplexer may be operable in a third mode in which it maps a third number of the inputs/outputs to a first number of the pads with a third median spacing between those pads, the third number being between the first and second numbers and the third spacing being between the first and second spacings.

The pads may be disposed around the periphery of the die.

The die may comprise a memory storing definitions of the mappings to be performed by the multiplexer in the first and second modes, the multiplexer being responsive to the memory to adopt a mapping as defined by the memory.

The die may comprise one or more one-time-programmable elements whose state determines which of the mappings stored in the memory is to be adopted by the multiplexer.

According to a second aspect of the invention there is provided a set of packaged semiconductor dies, the dies being as claimed in any preceding claim, and the set of packaged dies comprising: a first packaged die comprising a die as claimed in any preceding claim with the multiplexer operating in the first mode; and a second packaged die comprising a die as claimed in any preceding claim with the multiplexer operating in the second mode; the package of the second packaged die being smaller than the package of the first packaged die.

According to a third aspect of the present invention there is provided a method of manufacturing a packaged semiconductor die, the die being as claimed in any preceding claim, and the method comprising: selecting a package size for the die; selecting in dependence on the package size the first mode or the second mode and causing the multiplexer to operate in that mode; and packaging the die in a package of the selected size. The package in which the die is packaged may be a block of insulating material. The insulating material may encapsulate the die. The insulating material may intimately adhere to the die.

The method may comprise the step of making connections from the pads that are used in the selected mode to external terminals on the package. The method may comprise the step of making connections from only the pads that are used in the selected mode to external terminals on the package.

The angle at which each connection extends from the side of the die from which it emanates may be greater than 40°, 45° or 50°. That angle may be judged in plan view, i.e. the angle of the connection or lead as projected on to the plane of the die. Alternatively it may be the angle between the connection or lead and a face of the pad to which that connection or lead connects.

BRIEF DESCRIPTION OF THE DRAWINGS

The present invention will now be described by way of example with reference to the accompanying drawings. In the drawings.

DETAILED DESCRIPTION

Figure 1:
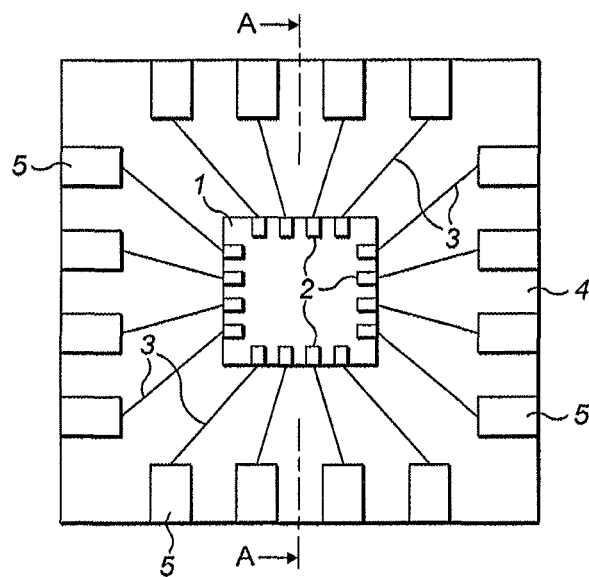
FIG. 1 is a plan cross-section through an integrated circuit package.
Figure 2:
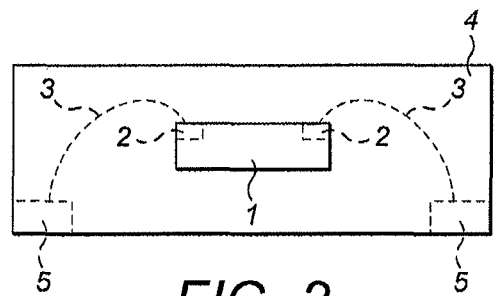
FIG. 2 is a simplified cross section on line A-A in FIG. 1.
Figure 3:
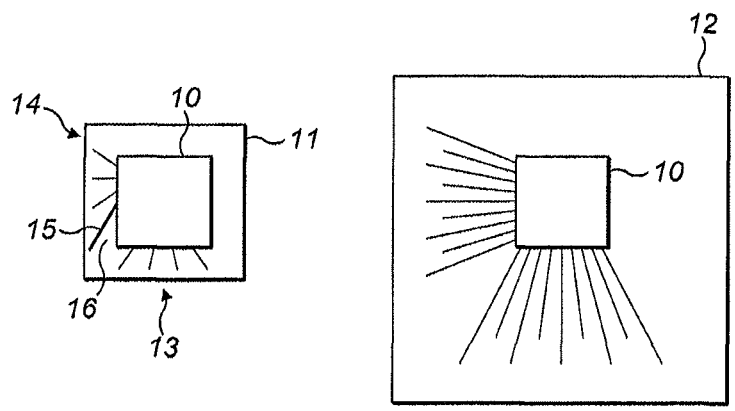
FIG. 3 illustrates small and large device packages.
Figure 4:
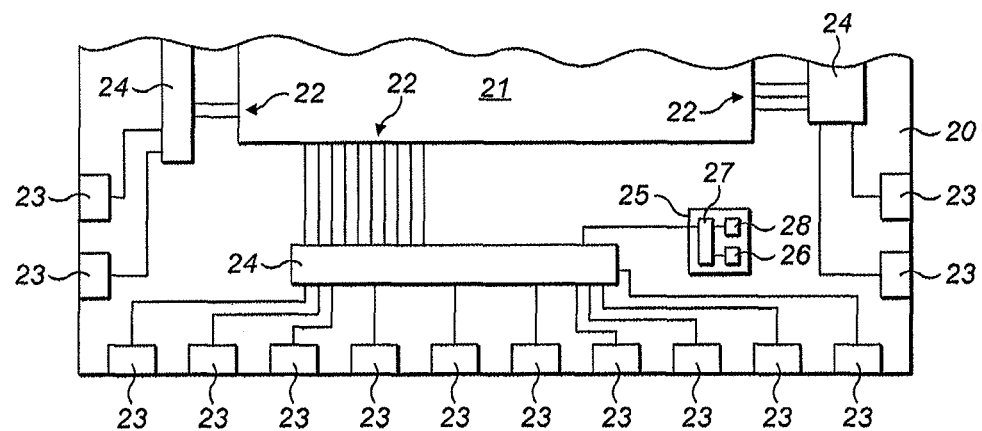
FIG. 4 shows part of a die.

FIG. 4 shows part of a die 20. The die comprises a primary logic block 21. The primary logic block terminates in multiple input/output ports shown generally at 22. Some or all of those ports need to be connected to pads 23 at the periphery of the die. Multiplexers 24 are located between the pads and the ports. Each multiplexer is capable of mapping each of the ports to which it is attached to any of the pads to which it is attached. A pairing of port and pad that are mapped to each other are connected electrically through the multiplexer. The way in which the multiplexer maps between the ports and the pads depends on the state of a memory 25. Memory 25 can be configured so that suitable port-to-pad mappings are implemented for both small and large packages.

In more detail, the die is fabricated on a single semiconductor substrate. Conductive and active elements are fabricated on the die by photolithography, etching, deposition, doping etc. Those elements define the components shown in FIG. 4.

Primary logic block 21 performs the principal data processing functions of the die. For example primary logic block 21 may contain any one or more of a microprocessor, a state machine, transceiver logic for a wired or wireless communications protocol, memory and so on. In order to function, the primary logic block must receive inputs from and provide outputs to devices off the die. Those inputs and outputs are passed to and from the die through ports 22.

The die has numerous pads. These can conveniently be located around the periphery of the die, but other layouts are possible.

The die can be packaged in a number of ways. In at least one packaging format a subset of the conductive lines contained in the ports as a whole are mapped to a subset of the pads. This is a small form package. The number of conductive lines and pads used in the small form package is $n_S$. In another packaging format more of the conductive lines are mapped to a larger set of the pads. This is a large form package.

The number of conductive lines and pads used in the large form package is $n_L$. $n_S$ is smaller than $n_L$. There is also a medium form package that uses $n_M$ conductive lines and pads, where $n_S < n_M < n_L$.

Memory 25 defines the mappings between ports and pads for the small, medium and large form packages. The way in which it does this will be described further below.

The mappings implemented by the multiplexer allow the pinouts from the die to have a convenient form in each of the small, medium and large packages. To avoid tight bond angles in smaller packages, which can lead to reliability problems, it is preferred that the pads that are used in the small package and potentially in the medium package are spread apart from one another. To avoid illogical or inconvenient pinouts it is preferred that ports that form a collective logical function, for example by collectively implementing a single interface protocol, are presented on a contiguous set of the pads in any package format in which they are presented. Thus it is preferred that in each package format in which ports implementing a certain interface protocol are presented on pads, those ports are presented on a contiguous set of the pads that are used in that protocol.

The following table illustrates a part of the port-to-pad mapping for the small, medium and large forms.

|  | Maps to pad . . . | | |
| --- | --- | --- | --- |
| Port | Small form | Medium form | Large form |
| 0 | 0 | 2 | 0 |
| 1 | 3 | 4 | 1 |
| 2 | 6 | 6 | 2 |
| 3 | 9 | 8 | 3 |
| 4 | Not used | Not used | 4 |
| 5 | Not used | 0 | 5 |
| 6 | Not used | Not used | 6 |

Ports 0 to 3 implement a collective logical function. They could, for example implement the wires of a UART interface or an Ethernet interface. In each form they are presented on adjacent ones of the pads that are used in that form. All pads are used in the large form. Every second pad is used in the medium form. Every third pad is used in the small form. This means that the used pads are evenly spread out in the small and medium forms, mitigating the potential problems of tight lead-out angles from the pads when there is a narrow margin between the edge of the die and the edge of the package. The more pads are used in each package, the less the average spacing between each used pad.

The memory 25 defines the mappings, for example as illustrated in the table above. It may do that by storing a set of bitmaps to which the multiplexer is responsive. Each bitmap defines for each input of the multiplexer the output of the multiplexer to which that input should map. The memory stores predetermined bitmaps for the outputs needed for all the desired packaging forms. To select one of these bitmaps for use, the memory may contain a one-time-programmable store 26. The one-time-programmable store is programmable only once. It could be programmed after the die has been fabricated but before it is packaged. Alternatively it could be programmed after the die has been packaged, by means of connections into the die from a set of pads that are by default connected to certain pins of the package for the purpose of this initial programming. The one-time-programmable store could be constituted by a set of fusible links. The memory 25 contains a multiplexer 27. The multiplexer 27 selects one of the bitmaps stored in bitmap store 28 in dependence on the state of the one-time-programmable store 26. In this way the die can be fabricated identically for all packaging forms.

Alternatively, the multiplexer 24 may at fabrication be capable of implementing any mapping, but then itself be one-time-programmable after fabrication to define a mapping that is to be used. In that case the memory 25 is not required.

The set of mappings that are used for different sizes of chips may have any of the following properties independently of each other. First, in each mapping groups of ports that operate together to provide a common function, for example an interface, can be directed to a contiguous group of the ports that are in use in that mapping. Second, the mean spacing between the pads that are in use may be greater the fewer pads are used. Third, it may be that most, or even all, of the spacings between pads are greater the fewer pads are used. The spacing referred to is between each pad and its adjacent pad. When the pads are arranged around the periphery of the die the spacing referred to is around the periphery of the die. The effect of either of the second and third features may be that in each package the bond leads extend from the chip at an angle of no less than 45° to the side of the chip from which they extend. This is especially advantageous for packages such as QFN, DFN (dual flat no leads), QFP (quad flat package) and the like. In these packages it is efficient for the bond leads to run directly from the chip pads to the package pins with no intermediate layer or other structure for remapping the pattern of the connectors. In these packages there is typically a single wire or other monolithic conductive element extending fully from each chip pad that is in use to each package pin that is in use. If reliable connections can be made straight from the chip pads to the package pins in devices of this type, manufacturing costs can be significantly reduced.

As illustrated in FIG. 4 there may be several multiplexers 24 arranged between the ports and the pads. There may be one multiplexer for each side of the chip. Alternatively there could be only one or two multiplexers for the whole chip. Each multiplexer could be a dedicated multiplexing block. It could be a switch matrix.

Depending on its purpose, each pad or port could be used solely for input, solely for output or for both input and output.

Figure 5:
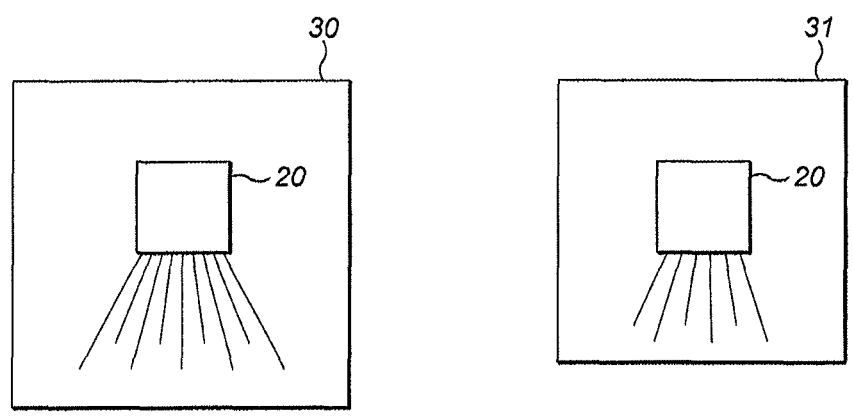
FIG. 5 shows packaged dies.
Figure 5:
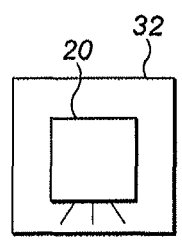

FIG. 5 illustrates the die 20 of FIG. 4 packaged in small (30), medium (31) and large (32) packages. For clarity the connections from pads on only one side of the die are shown. In each case the package (30, 31, 32) is a block of insulating material that encapsulates and adheres to the die. The median spacing between adjacent used pads in the larger package is smaller than in the medium package, whose median spacing between adjacent used pads is in turn smaller than in the smaller package.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A semiconductor die having:
   a logic unit having a plurality of inputs/outputs;
   a plurality of pads whereby electrical connections can be made to the die; and
   a multiplexer arranged between the inputs/outputs and the pads,
   the multiplexer being operable in a first mode in which the mutliplexer maps a first number of the inputs/outputs to a first number of the pads consisting of all used pads in the first mode with a first median spacing between each one of the pads of the first number of the pads disposed on a same side of the die, and
   the multiplexer being operable in a second mode in which the mutliplexer maps a second number of the inputs/outputs to a second number of pads consisting of all used pads in the second mode, the second number of pads being a first subset of the first number of the pads, with a second median spacing between each one of the pads of the second number of the pads disposed on the same side of the die,
   wherein the first number of the input/outputs is larger than the second number of the input/outputs and the first median spacing is smaller than the second median spacing.

2. A semiconductor die as claimed in claim 1, wherein in the second mode the pads that are mapped to the second number of the inputs/outputs and are on a same side of the die as each other are separated by at least one other pad that is not used.

3. A semiconductor die as claimed in claim 1, wherein the die comprises one or more one-time-programmable elements whose state determines whether the multiplexer operates in the first mode or the second mode.

4. A semiconductor die as claimed in claim 1, wherein the multiplexer is operable in a third mode in which the multiplexer maps a third number of the inputs/outputs to a third number of pads consisting of all used pads in the third mode, the third number of pads being a second subset of the first number of the pads with a third median spacing between each one of the pads in the third number of pads, the third number of the inputs/outputs being between the first and second numbers of the inputs/outputs and the third median spacing being between the first and second median spacings.

5. A semiconductor die as claimed in claim 4, wherein an angle at which each connection mapped between the plurality of pads and the plurality of inputs/outputs in the third mode extends from one of the plurality of pads on a side of the die from which the connection emanates to a package connection pin at an angle greater than 45°.

6. A semiconductor die as claimed in claim 1, wherein the pads are disposed around the periphery of the die.

7. A semiconductor die as claimed in claim 1, comprising a memory storing definitions of mappings to be performed by the multiplexer in the first and second modes, the multiplexer being responsive to the memory to adopt a mapping as defined by the memory.

8. A semiconductor die as claimed in claim 7, wherein the die comprises one or more one-time-programmable elements, wherein the state of the one or more one-time-programmable elements determines which of the mappings stored in the memory is adopted by the multiplexer.

9. A semiconductor die as claimed in claim 1, wherein each connection mapped between the plurality of pads and the plurality of inputs/outputs in the first mode and the second mode extends from one of the plurality of pads on a side of the die from which the connection emanates to a package connection pin at an angle greater than 45°.

10. A method of manufacturing a packaged semiconductor die, the die having a logic unit having a plurality of inputs/outputs; a plurality of pads whereby electrical connections can be made to the die; and a multiplexer arranged between the inputs/outputs and the pads, the multiplexer being operable in a first mode in which the mutliplexer maps a first number of the inputs/outputs to a first number of the pads consisting of all used pads in the first mode with a first median spacing between each one of the pads of the first number of the pads disposed on a same side of the die, and the multiplexer being operable in a second mode in which the mutliplexer maps a second number of the inputs/outputs to a second number of pads consisting of all used pads in the second mode, the second number of pads being a first subset of the first number of the pads with a second median spacing between each one of the pads in the second number of the pads disposed on the same side of the die, wherein the first number of the input/outputs is larger than the second number of the input/outputs and the first median spacing is smaller than the second median spacing; the method comprising:

selecting a package size for the die;
selecting in dependence on the package size the first mode or the second mode and causing the multiplexer to operate in that mode; and
packaging the die in a package of the selected size.

11. A method as claimed in claim 10, comprising the step of making connections from the pads that are used in the selected mode to external terminals on the package.

12. A method as claimed in claim 11, comprising the step of making connections from only the pads that are used in the selected mode to external terminals on the package.

13. A method as claimed in claim 10, wherein an angle at which each connection extends from a side of the die from which the connection emanates is greater than 45°.

14. A set of packaged semiconductor dies, comprising:
a first semiconductor die in a first package, the first semiconductor die comprising:
  a first logic unit having a first plurality of inputs/outputs;
  a first plurality of pads whereby electrical connections can be made to the die; and
  a first multiplexer arranged between the first plurality of the inputs/outputs and the first plurality of the pads,
    the first multiplexer being operable in a first mode in which the mutliplexer maps a first number of the first plurality of the inputs/outputs to a first number of the first plurality of the pads consisting of all used pads in the first mode with a first median spacing between each one of the pads of the first number of the first plurality of the pads disposed on a same side of the die; and
a second semiconductor die in a second package, the second semiconductor die comprising:
  a second logic unit having a second plurality of inputs/outputs;
  a second plurality of pads whereby electrical connections can be made to the die; and
  a second multiplexer arranged between the second plurality of the inputs/outputs and the second plurality of the pads,
    the second multiplexer being operable in a second mode in which the mutliplexer maps a second number of the second plurality of the inputs/outputs to a second number of the second plurality of the pads consisting of all used pads in the second mode, the second number of pads being a first subset of the first number of the pads with a second median spacing between each one of the pads of the second number of the second plurality of the pads disposed on the same side of the die,
wherein the first number of the input/outputs is larger than the second number of the input/outputs and the first median spacing is smaller than the second median spacing, and
wherein the package of the second packaged die is smaller than the package of the first packaged die.

* * * * *